US007550899B2

(12) United States Patent
Fujiwara et al.

(10) Patent No.: US 7,550,899 B2
(45) Date of Patent: Jun. 23, 2009

(54) PIEZOELECTRIC ELECTROACOUSTIC TRANSDUCING DEVICE

(75) Inventors: Satoru Fujiwara, Osaka (JP); Yuka Nagata, Osaka (JP)

(73) Assignee: Hosiden Corporation, Yao-shi, Osaka (JP)

( * ) Notice: Subject to any disclaimer, the term of this patent is extended or adjusted under 35 U.S.C. 154(b) by 0 days.

(21) Appl. No.: 11/878,009

(22) Filed: Jul. 20, 2007

(65) Prior Publication Data

US 2008/0048525 A1 Feb. 28, 2008

(30) Foreign Application Priority Data

Jul. 20, 2006 (JP) ............................ 2006-197651

(51) Int. Cl.
*H01L 41/08* (2006.01)

(52) U.S. Cl. ...................... 310/324; 310/349; 310/351; 310/353

(58) Field of Classification Search ................. 310/311, 310/324, 330–333, 348, 349, 351, 353
See application file for complete search history.

(56) References Cited

U.S. PATENT DOCUMENTS

| | | | | |
|---|---|---|---|---|
| 1,619,854 | A * | 3/1927 | Crossley | 310/349 |
| 4,597,099 | A * | 6/1986 | Sawafuji | 381/190 |
| 4,638,205 | A * | 1/1987 | Fujita et al. | 310/312 |
| 5,068,018 | A * | 11/1991 | Carlson | 204/554 |
| 5,784,340 | A * | 7/1998 | Kanai | 367/140 |
| 6,803,700 | B2 * | 10/2004 | Maushard et al. | 310/330 |
| 7,259,499 | B2 * | 8/2007 | Askew et al. | 310/328 |
| 2007/0200453 | A1 * | 8/2007 | Heim | 310/311 |
| 2007/0200454 | A1 * | 8/2007 | Smith | 310/311 |
| 2007/0200466 | A1 * | 8/2007 | Heim | 310/800 |
| 2007/0200467 | A1 * | 8/2007 | Heydt et al. | 310/800 |
| 2007/0200468 | A1 * | 8/2007 | Heim | 310/800 |
| 2008/0049955 | A1 * | 2/2008 | Fujiwara et al. | 381/190 |

FOREIGN PATENT DOCUMENTS

| | | |
|---|---|---|
| JP | 01-130699 | * 5/1989 |
| JP | 927 1096 | 10/1997 |
| JP | 2001 339791 | 12/2001 |
| JP | 2001 339793 | 12/2001 |

* cited by examiner

*Primary Examiner*—Thomas M Dougherty
(74) *Attorney, Agent, or Firm*—Bacon & Thomas, PLLC

(57) ABSTRACT

In order to improve the sound pressure level and the sound quality of a piezoelectric electroacoustic transducing device without impairing the size, the productivity, the cost, and the like of the device, the piezoelectric electroacoustic transducing device 1 has: a frame 20; a piezoelectric vibrator 10 in which piezoelectric elements 12, 13 are bonded to a metal plate 11; and a support member 30 which supports a peripheral portion of the piezoelectric vibrator 10 on the frame 20, and which is made of a resin film such as a ring-like PET resin, and a mesh or embossed concave and convex structure is formed on the surface of the support member 30. While maintaining the external shape of the support member 30, the support member 30 is provided with a flexibility at which a large displacement of the piezoelectric vibrator 10 is not impeded.

5 Claims, 3 Drawing Sheets

PIEZOELECTRIC ELECTROACOUSTIC TRANSDUCING DEVICE

BACKGROUND OF THE INVENTION

1. Field of the Invention

The present invention relates to a piezoelectric electroacoustic transducing device which is to be incorporated in an electronic apparatus such as a portable telephone, a PDA, a PC, or a digital camera, and which is used as a sound source.

2. Description of the Prior Art

Patent Reference 1 (Japanese Patent Application Laying Open No. 9-271096) and Patent Reference 2 (Japanese Patent Application Laying Open No. 2001-339793) disclose an invention of a piezoelectric electroacoustic transducing device comprising: a frame; a piezoelectric vibrator in which a piezoelectric element is bonded to a metal plate; and a support member which supports a peripheral portion of the piezoelectric vibrator on the frame. In Patent Reference 1, paragraph [0020] discloses a configuration in which the support member is formed by a thin plate of a resin of, for example, a polyester such as PET or PBT, a polyimide, vinyl chloride, or another plastic. In Patent Reference 2, paragraph [0019] discloses a configuration in which the support member has a plate- and ring-like shape, and is formed by a molded product of, for example, plastic or carbon. Patent Reference 3 (Japanese Patent Application Laying Open No. 2001-339791) discloses a technique in which a support member is provided with a bent portion that is bent in the thickness direction, in order to improve the sound pressure level and the sound quality of a piezoelectric electroacoustic transducing device without impeding a large displacement of a piezoelectric vibrator.

In the inventions disclosed in Patent References 1, 2, the relatively hard material is used in the support member. Therefore, the inventions have a problem that a large displacement of the piezoelectric vibrator is impeded. This problem can be solved by applying the technique disclosed in Patent Reference 3 to the inventions disclosed in Patent References 1, 2.

SUMMARY OF THE INVENTION

Problems to be solved by the invention are as follows. In Patent Reference 3, the support member is provided with the bent portion that is bent in the thickness direction, whereby a large displacement of the piezoelectric vibrator is prevented from being impeded. However, this technique cannot be applied to the case where there is no dimensional room space for allowing a large bent portion to be formed between the piezoelectric vibrator and the frame. Originally, a piezoelectric electroacoustic transducing device is used as a sound source of a small electronic apparatus because the device can have an external shape of reduced size and thickness as compared with a dynamic electroacoustic transducing device. Therefore, there is no dimensional room space for allowing a large bent portion to be formed between the piezoelectric vibrator and the frame. Consequently, the technique disclosed in Patent Reference 3 cannot be applied to the inventions disclosed in Patent References 1, 2. In a piezoelectric electroacoustic transducing device comprising: a frame; a piezoelectric vibrator in which a piezoelectric element is bonded to a metal plate; and a support member which supports a peripheral portion of the piezoelectric vibrator on the frame, a large displacement of the piezoelectric vibrator is impeded, and the sound pressure level and the sound quality are lowered. Even when a large bent portion can be formed between the piezoelectric vibrator and the frame, the size increase of the piezoelectric element is further restricted. Therefore, there arise disadvantages such as that the counter-measure to increase the size of the piezoelectric element to enhance the sound pressure level of the low-frequency range and improve the sound quality cannot be performed, that, in the bent portion, collapse (a dent or the like) easily occurs during an assembling process or vibration, and its function is hardly maintained, and that the molding process is cumbersome and difficult to do, thereby increasing the cost.

In order to solve the problems, the invention provides a piezoelectric electroacoustic transducing device comprising: a frame; a piezoelectric vibrator in which a piezoelectric element is bonded to a metal plate; and a ring-like support member which supports a peripheral portion of the piezoelectric vibrator on the frame, wherein a concave and convex structure is formed on a surface of the support member. Because of the concave and convex structure of the surface of the support member, while maintaining the external shape of the support member, the support member is provided with a flexibility at which a large displacement of the piezoelectric vibrator is not impeded. When the support member is bonded by using an adhesive agent to the metal plate and the frame of the piezoelectric vibrator, the bonding strength is enhanced, and the molding process can be easily performed without causing the concave and convex structure to be readily collapsed. Therefore, the sound pressure level and the sound quality of the piezoelectric electroacoustic transducing device can be improved without impairing the size, the productivity, the cost, and the like of the device.

In the invention, preferably, the support member is configured by a resin film in which a mesh-like concave and convex structure is formed on the surface, or an embossed concave and convex structure is formed on the surface. As the molding material of the resin film, for example, a polyethylene terephthalate (PET) resin, a polyethylene naphthalate (PEN) resin, a polyether imide (PEI) resin, a polyimide (PI) resin, a polyamide (PA) resin, or the like is preferable because such a material is excellent in rigidity, easily molded, and low in material cost.

Preferably, the concave and convex structure is formed in one or each of both faces of the support member.

Preferably, the piezoelectric vibrator is configured by bonding the piezoelectric element to one or each of both faces of the metal plate.

DETAILED DESCRIPTION OF THE PREFERRED EMBODIMENT

Figure 1A:
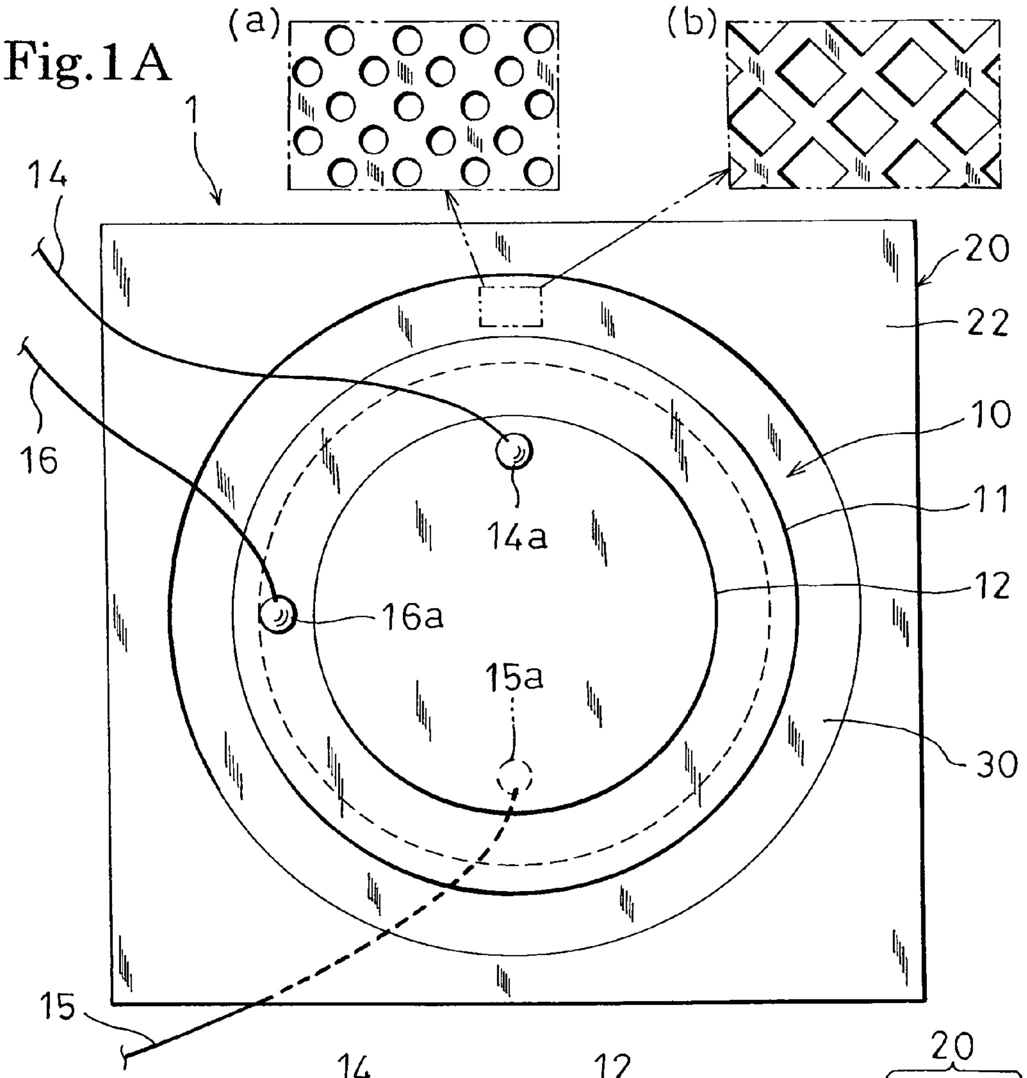
FIG. 1A is a plan view of a piezoelectric electroacoustic transducing device of an embodiment of the invention.
Figure 1B:
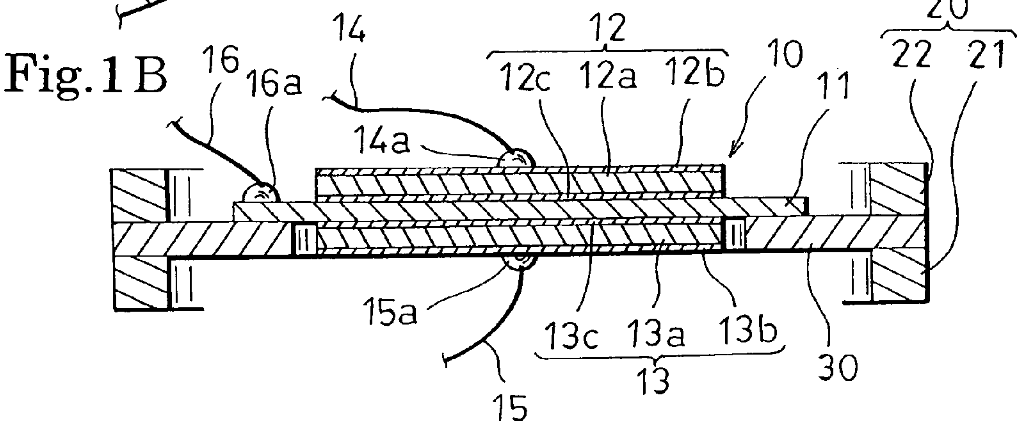
FIG. 1B is a section view of the device.

Hereinafter, a piezoelectric electroacoustic transducing device of an embodiment of the invention will be described with reference to the accompanying drawings. As shown in FIGS. 1A and 1B, the piezoelectric electroacoustic transducing device 1 is configured by: a frame 20; a piezoelectric vibrator 10 in which thin disk-like first and second piezoelectric elements 12, 13 are concentrically bonded to the both faces (front and rear faces) of a thin disk-like metal plate 11, respectively; and a ring-like support member 30 which is disposed between the piezoelectric vibrator 10 and the frame 20, and which supports a peripheral portion of the piezoelectric vibrator 10 on the frame 20.

The diameter (diameter of the piezoelectric vibrator 10) of the metal plate 11 is larger than the diameters of the first and second piezoelectric elements 12, 13. In FIG. 1, the first and second piezoelectric elements 12, 13 having the same diameter (same surface area) are shown. Alternatively, first and second piezoelectric elements 12, 13 having different diameters may be used.

As the metal plate 11, for example, a metal plate which has a thickness of several tens of μm, and which is made of a nickel-iron alloy, a cupper alloy such as brass or phosphor bronze, stainless steel, or the like is preferably used.

In the first piezoelectric element 12, thin-film like electrodes 12*b*, 12*c* are formed on the faces of a thin disk-like piezoelectric member 12*a*, respectively. In the second piezoelectric element 13, similarly, thin-film like electrodes 13*b*, 13*c* are formed on the faces of a thin disk-like piezoelectric member 13*a*, respectively. As the piezoelectric members 12*a*, 13*a*, for example, piezoelectric ceramics of lead zirconate titanate (PZT) having a thickness of several tens of μm are preferably used.

For example, the electrodes 12*b*, 12*c*, 13*b*, 13*c* are formed as thin-film metal electrodes having a thickness of several μm by the evaporation method or the sputtering method, on the faces of the piezoelectric members 12*a*, 13*a*. Alternatively, the electrodes are formed as electrodes which has a thickness of several μm, and which is obtained by performing screen printing on a paste-like electrode material containing a silver component, and then firing it, on the faces of the piezoelectric members 12*a*, 13*a*.

The bonding between the first piezoelectric element 12 and the metal plate 11 is performed by sticking one face of the first piezoelectric element 12 on the side of the electrode 12*c* by an adhesive agent so that, for example, the electrode 12*c* which is on the side of the one face of the first piezoelectric element 12 is electrically conductive with the metal plate 11. Similarly, the bonding between the second piezoelectric element 13 and the metal plate 11 is performed by sticking one face of the second piezoelectric element 13 on the side of the electrode 13*c* by an adhesive agent so that, for example, the electrode 13*c* which is on the side of the one face of the second piezoelectric element 13 is electrically conductive with the metal plate 11.

As described above, the thin disk-like first and second piezoelectric elements 12, 13 are concentrically bonded to the both faces of the thin disk-like metal plate 11, respectively, thereby configuring the piezoelectric vibrator 10 as a bimorph type one.

In the piezoelectric vibrator 10 of the bimorph type, a first lead wire 14 is connected by a solder 14*a* to the non-bonding electrode 12*b* of the first piezoelectric element 12, a second lead wire 15 is connected by a solder 15*a* to the non-bonding electrode 13*b* of the second piezoelectric element 13, and a third lead wire 16 is connected by a solder 16*a* to an outer edge portion of the one face of the metal plate 11.

In a state where the first and second lead wires 14, 15 are short-circuited together, a driving voltage is applied from an external circuit between the lead wires and the third lead wire 16, or the driving voltage is applied from the external circuit between the electrodes 12*b*, 12*c* formed on the faces of the first piezoelectric element 12, and between the electrodes 13*b*, 13*c* formed on the faces of the second piezoelectric element 13, thereby producing a radial displacement. This displacement causes the metal plate 11 to deflect, whereby vertical vibration is caused in the piezoelectric vibrator 10 to generate a sound.

A predetermined high voltage is previously applied to the first and second piezoelectric elements 12, 13 so that the elements are polarized in the thickness direction, thereby performing an electric polarizing process. When an electric field in the same direction as the polarization direction is applied to the first piezoelectric element 12, an electric field in the direction opposite to the polarization direction is applied to the second piezoelectric element 13 in order to prevent the displacements of the first and second piezoelectric elements 12, 13 from offsetting each other.

The frame 20 is configured by first and second frame members 21, 22 which clamp an outer edge portion of the support member 30 that will be described later, vertically (in the front and rear direction). The frame members have the same structure. Therefore, only the first frame member 21 will be described, and the description of the second frame member 22 will be omitted. In the first frame member 21, for example, a circular through hole is concentrically opened in a middle portion of a resin or metal plate having a thickness of several hundreds of μm and a substantially square shape. The inner diameter of the first frame member 21 is larger than the outer diameter (diameter of the metal plate 11) of the piezoelectric vibrator 10, and also than the inner diameter of the support member 30 which will be described later, and smaller than the outer diameter of the support member. In the external shape (size) of the first frame member 21, one edge has a length which is substantially equal to the outer diameter of the support member 30 that will be described later. Alternatively, the external shapes of the first and second frame members 21, 22, i.e., the frame 20 may be formed into a circular shape.

The support member 30 is configured by a ring-like resin film. In the support member 30, for example, a resin film having a thickness of several tens of μm of a polyethylene terephtalate (PET) resin, a polyethylene naphthalate (PEN) resin, a polyether imide (PEI) resin, a polyimide (PI) resin, a polyamide (PA) resin, or the like is preferably used because such a resin film is excellent in rigidity, easily molded, and low in material cost. Alternatively, a resin film having a two-layer structure which is formed by bonding together two such ring-like resin films may be preferably used. The inner diameter of the support member 30 is larger than the diameters of the first and second piezoelectric elements 12, 13, and larger than the outer diameter of the metal plate 11 (piezoelectric vibrator 10). The outer diameter of the support member 30 is substantially equal to the length of one edge of the frame 20.

On the surface of the support member 30, a concave and convex structure is formed in order to provide the support member 30 with a flexibility at which a large displacement of the piezoelectric vibrator 10 is not impeded. The concave and convex structure is formed as a mesh-like concave and convex structure (see (a) of FIG. 1A) in the following manner. For example, a resin film is placed on a fabric, and a heat-sensitive ring is placed thereon. Then, heat is applied to the assembly from the upper side to transfer a mesh of the fabric to the surface of the resin film. Alternatively, the concave and convex structure is formed as an embossed concave and convex structure (see (b) of FIG. 1A) by applying an embossing process to the resin film. The resin film in which such a mesh-like concave and convex structure or an embossed concave and convex structure is formed on the surface is punched into a ring-like shape, thereby producing the support member

30. The concave and convex structure may be formed only on one face of the support member 30, or on each of the both faces.

The piezoelectric electroacoustic transducing device 1 is assembled by using the above-described components in the following manner. (1) One face of the inner edge portion of the support member 30 is applied and bonded to the outer edge portion of the one face of the metal plate 11, by, for example, a rubber elastic adhesive agent of a JIS-A hardness of 40 or less, so that the support member 30 is concentrically attached to the periphery of the piezoelectric vibrator 10. (2) In the other face opposite to the one face of (1) above, the outer edge portion of the support member 30 is applied and bonded to the upper face of the first frame member 21 by, for example, a rubber elastic adhesive agent of a JIS-A hardness of 10 or less, or an acrylic adhesive agent so that the piezoelectric vibrator 10 is concentrically attached to the inner side of the first frame member 21 via the support member 30. (3) The lower face of the second frame member 22 is applied and bonded by an adhesive agent similar to that of (2) above to the face of the outer edge portion of the support member 30 which is opposite to the face of (2), to configure the frame 20 consisting of the first and second frame members 21, 22 which are vertically stacked and integrated together in a state where the outer edge portion of the support member 30 is vertically clamped. In this way, a semifinished product of the piezoelectric electroacoustic transducing device is assembled in which the piezoelectric vibrator 10 is vibratably housed and held via the support member 30 inside the frame 20 in which the upper and lower faces are opened. (4) In the semifinished product of the piezoelectric electroacoustic transducing device, the first lead wire 14 is connected by the solder 14*a* to the non-bonding electrode 12*b* of the first piezoelectric element 12, and the second lead wire 15 is connected by the solder 15*a* to the non-bonding electrode 13*b* of the second piezoelectric element 13. Furthermore, the third lead wire 16 is connected by the solder 16*a* to an outer edge portion of the metal plate 11 which is opposite to the one face of (1) above. As a result, the piezoelectric electroacoustic transducing device 1 is assembled.

Alternatively, the piezoelectric electroacoustic transducing device 1 may be assembled in the following manner. The outer edge portion of the support member 30 is bonded to the upper face of the first frame member 21, the outer edge portion of the metal plate 11 is bonded to the inner edge portion of the support member 30, and thereafter (3) above is performed. Alternatively, the outer edge portion of the support member 30 is bonded to the upper face of the first frame member 21, the lower face of the second frame member 22 is bonded to the outer edge portion of the support member 30 to configure the frame 20, and thereafter (1) above is performed, thereby assembling a semifinished product of the piezoelectric electroacoustic transducing device. The solder connections of the lead wires 14, 15, 16 are performed after the assembling of the semifinished product of the piezoelectric electroacoustic transducing device. In the bonding between the metal plate 11 or the piezoelectric vibrator 10 and the support member 30, a soft adhesive agent was used so that the piezoelectric vibrator 10 easily deflects, for purposes of broadening of the frequency characteristics, and the like. In the bonding between the first and second frame members 21, 22 of the frame 20 and the support member 30, a hard adhesive agent which has a high adhesive strength, and which exhibits a high durability was used so that, when the piezoelectric vibrator 10 is driven, the piezoelectric vibrator 10 and the support member 30, i.e., the vibration system does not disengage from the frame 20. Alternatively, a soft adhesive agent may be used so that a gap which may cause leakage of sound is not formed between the vibration system and the frame 20. The connections of the lead wires 14, 15, 16 may be realized by other bonding means such as welding or a conductive adhesive agent in place of the solders 14*a*, 15*a*, 16*a*.

In the piezoelectric electroacoustic transducing device 1, the circular openings are formed in the upper and lower faces (front and rear faces) of the frame 20, and hence a sound can be emitted from either of the faces. Namely, a sound can be emitted from any one of the side of the piezoelectric vibrator 10 where the first piezoelectric element 12 exists, and that where the second piezoelectric element 13 exists. The frame 20 has a two-piece structure consisting of the first and second frame members 21, 22. In order to more surely integrate the first and second frame members 21, 22 with each other, and to surely maintain the integration, the outer edge portion of the frame 20 may be covered by a metal cover or the like to clamp the first and second frame members 21, 22. The external shape of the frame 20 is formed into a substantially square shape. Alternatively, the external shape may be formed into a circular shape. A frame member having a one-piece structure may be used as the frame 20. In this case, a stepped face is disposed on the inner wall face of the frame member, so that the outer edge portion of the support member 30 is bonded to the stepped face, whereby the piezoelectric vibrator 10 can be held. A ring-like press member may be used so that the outer edge portion of the support member 30 is clamped by the press member and the stepped face in the same manner as the case of the first and second frame members 21, 22.

For example, the piezoelectric electroacoustic transducing device 1 may be mounted inside a sound hole disposed in a housing of a portable telephone, and emit a sound in the front direction with respect to the flat face portion of the piezoelectric vibrator 10. Alternatively, a sound may be emitted in a lateral direction. Ends of the lead wires 14, 15, 16 are solder-connected to predetermined soldering lands of the substrate, respectively, and the device is used as a piezoelectric speaker.

Figure 2:
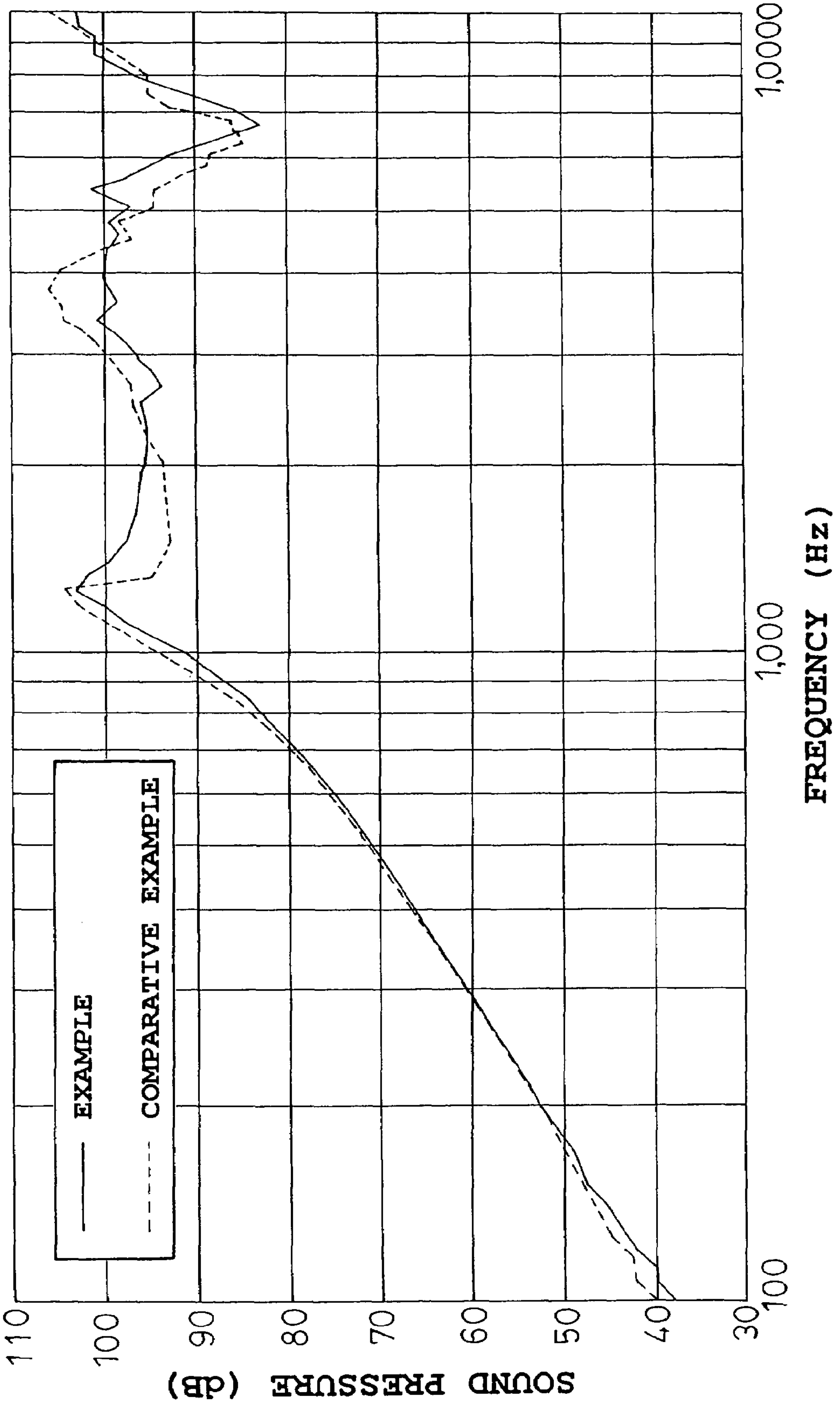
FIG. 2 is a graph showing frequency-sound pressure characteristics of the piezoelectric electroacoustic transducing device of the embodiment of the invention, and a comparative example to be compared therewith.

FIG. 2 is a graph showing frequency-sound pressure characteristics of a piezoelectric electroacoustic transducing device (hereinafter, referred to as example) of an example of the invention having the same structure as the above-described piezoelectric electroacoustic transducing device 1, and a conventional piezoelectric electroacoustic transducing device (hereinafter, referred to as comparative example). In the figure, the example is indicated by the solid line, and the comparative example by the broken line.

The comparative example has the same structure as the example except that the support member 30 in which a concave and convex structure is not formed on the surface is used.

Each of the example and the comparative example was disposed at a predetermined position, and a microphone was disposed at a position separated by 10 cm from the sound source. A driving voltage of 10 volt was applied between the electrodes 12*b*, 12*c* formed on the faces of the first piezoelectric element 12, and between the electrodes 13*b*, 13*c* formed on the faces of the second piezoelectric element 13, and frequency-sound pressure characteristics were measured. As apparent from FIG. 2, in the example, it will be seen that a higher sound pressure level is obtained in a frequency band of 1.5 to 2 kHz as compared with the comparative example.

Figure 3:
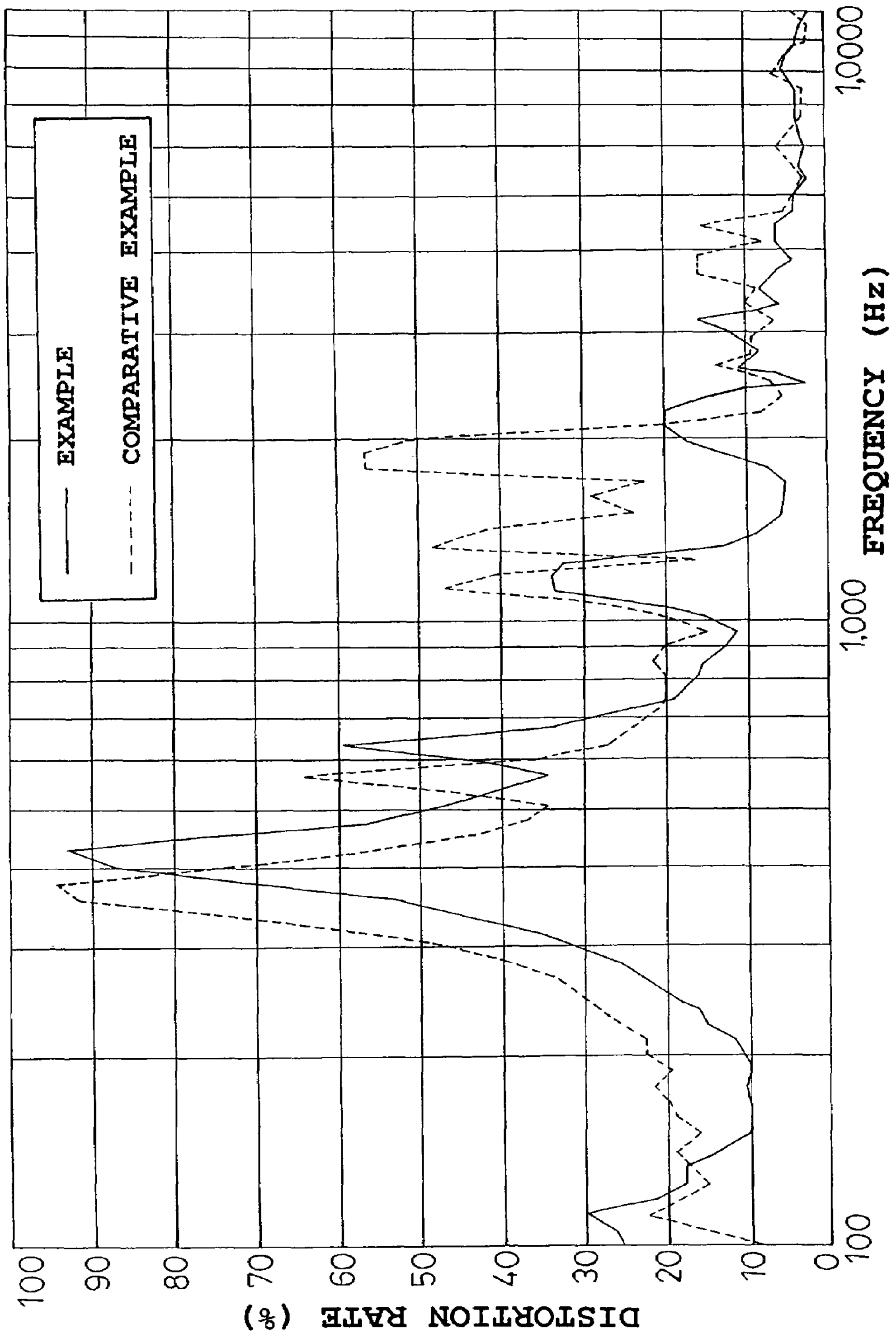
FIG. 3 is a graph showing frequency-distortion rate characteristics of the piezoelectric electroacoustic transducing device of the embodiment of the invention, and the comparative example to be compared therewith.

FIG. 3 is a graph showing frequency-distortion rate characteristics of the example and the comparative example. In the figure, the example is indicated by the solid line, and the comparative example by the broken line. As apparent from FIG. 3, in the example, it will be seen that a lower distortion rate is obtained in a frequency band of 1.5 kHz or higher as compared with the comparative example.

As seen from the above description, the piezoelectric electroacoustic transducing device 1 comprises: the frame 20; the piezoelectric vibrator 10 in which the piezoelectric elements 12, 13 are bonded to the metal plate 11; and the ring-like support member 30 which supports the peripheral portion of the piezoelectric vibrator 10 on the frame 20, and the concave and convex structure is formed on the surface of the support member 30.

Because of the concave and convex structure of the surface of the support member 30, while maintaining the external shape of the support member 30, the support member 30 is provided with a flexibility at which a large displacement of the piezoelectric vibrator 10 is not impeded. When the support member 30 is bonded by using an adhesive agent to the metal plate 11 and the frame 20 of the piezoelectric vibrator 10, the bonding strength is enhanced. The molding process can be easily performed without causing the concave and convex structure to be readily collapsed. The range where the concave and convex structure is formed on the surface of the support member 30 may extend over the whole face of the support member 30. Alternatively, the concave and convex structure may be formed only in an area excluding the outer edge portion of the support member 30 which is clamped by the frame 20.

The support member 30 can be configured by: a resin film in which a mesh-like concave and convex structure is formed on the surface; an urethane film; or a resin film in which an embossed concave and convex structure is formed on the surface, such as a polyethylene terephtalate (PET) resin, a polyethylene naphthalate (PEN) resin, a polyether imide (PEI) resin, a polyimide (PI) resin, or a polyamide (PA) resin that is excellent in rigidity, easily molded, and low in material cost.

Therefore, the sound pressure level and the sound quality of the piezoelectric electroacoustic transducing device can be improved without impairing the size, the productivity, the cost, and the like of the device.

Although a preferred embodiment of the invention has been described, the invention is not restricted to this, and may be variously modified and implemented without departing the spirit. For example, the invention can be suitably applied also to a piezoelectric electroacoustic transducing device of the unimorph type in which a piezoelectric vibrator of the unimorph type configured by bonding a piezoelectric element to only one face of a metal plate is held by a frame via a support member.

What is claimed is:

1. A piezoelectric electroacoustic transducing device comprising:

a frame;

a piezoelectric vibrator in which a piezoelectric element is bonded to a metal plate; and a plate- and ring-like support member in which an inner edge portion of said support member is connected to a peripheral portion of said piezoelectric vibrator, and an outer edge portion of said support member is connected to said frame, said plate-and ring-like support member having at least one flat surface defining a flat face, wherein:

a concave and convex structure is formed on a surface of said plate- and ring-like support member; and said peripheral portion of said piezoelectric vibrator is supported by said frame through said support members.

2. A piezoelectric electroacoustic transducing device according to claim 1, wherein:

said plate- and ring-like support member is configured by a resin film in which a mesh-like concave and convex structure is formed on said at least one flat surface.

3. A piezoelectric electroacoustic transducing device according to claim 1, wherein:

said plate- and ring-like support member is configured by a resin film in which an embossed concave and convex structure is formed on said at least one flat surface.

4. A piezoelectric electroacoustic transducing device according to claim 1, wherein:

said plate- and ring-like support member has generally parallel flat surfaces, each defining a flat face; and said concave and convex structure is formed in one or each of both flat faces of said plate- and ring-like support member.

5. A piezoelectric electroacoustic transducing device according to claim 1, wherein:

said piezoelectric vibrator is configured by bonding said piezoelectric element to one or each of both faces of said metal plate.

* * * * *